US009509385B2

(12) United States Patent
Gustavsson et al.

(10) Patent No.: US 9,509,385 B2
(45) Date of Patent: Nov. 29, 2016

(54) APPARATUS AND METHOD FOR DIGITAL BEAM-FORMING WITH LOW-RESOLUTION QUANTIZATION

(71) Applicant: Telefonaktiebolaget L M Ericsson (publ), Stockholm (SE)

(72) Inventors: Ulf Gustavsson, Gothenburg (SE); Thomas Eriksson, Gothenburg (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/382,057

(22) PCT Filed: Aug. 28, 2014

(86) PCT No.: PCT/EP2014/068225
§ 371 (c)(1),
(2) Date: Aug. 29, 2014

(87) PCT Pub. No.: WO2015/188894
PCT Pub. Date: Dec. 17, 2015

(65) Prior Publication Data
US 2015/0365151 A1 Dec. 17, 2015

Related U.S. Application Data

(60) Provisional application No. 62/010,710, filed on Jun. 11, 2014.

(51) Int. Cl.
*H04B 7/06* (2006.01)
*H04B 1/00* (2006.01)
*H04B 1/04* (2006.01)
*H03M 1/06* (2006.01)
*H03M 1/66* (2006.01)

(52) U.S. Cl.
CPC ............ *H04B 7/06* (2013.01); *H03M 1/0639* (2013.01); *H04B 1/0007* (2013.01); *H04B 1/04* (2013.01); *H04B 7/0617* (2013.01); *H03M 1/66* (2013.01); *H04B 2001/045* (2013.01)

(58) Field of Classification Search
CPC .......... H04B 1/7115; H04B 7/06; H04L 1/02
USPC .................................. 375/267, 299
See application file for complete search history.

(56) References Cited

U.S. PATENT DOCUMENTS

| 7,187,314 B1* | 3/2007 | Beamish ............... H03M 1/007 341/144 |
| 2007/0040718 A1 | 2/2007 | Lee |
| 2007/0230595 A1 | 10/2007 | Waxman |

FOREIGN PATENT DOCUMENTS

WO 0223731 A2 3/2002

OTHER PUBLICATIONS

International Search Report and Written Opinion issued on Jan. 28, 2015 in International Application No. PCT/EP2014/068225, 9 pages.

*Primary Examiner* — David S Huang
(74) *Attorney, Agent, or Firm* — Rothwell, Figg, Ernst & Manbeck, P.C.

(57) ABSTRACT

An antenna arrangement configured for digital beam-forming of a transmit signal comprising; a number N>1 of digital to analog converters, DACs, each of the N DACs being arranged to receive one respective digital transmit signal component, and to convert and output an analog transmit signal component, each of the N DACs having a respective resolution below a resolution required to fulfill a regulatory radio requirement in an interchangeable antenna arrangement arranged for transmission by a single antenna element connected to a single DAC; and N antenna elements, each of the N antenna elements being configured to receive one respective analog transmit signal component and to transmit the analog transmit signal component as part of the digitally beam-formed transmit signal.

23 Claims, 13 Drawing Sheets

APPARATUS AND METHOD FOR DIGITAL BEAM-FORMING WITH LOW-RESOLUTION QUANTIZATION

CROSS-REFERENCE TO RELATED APPLICATIONS

This application is a 35 U.S.C. §371 National Phase Entry Application from PCT/EP2014/068225, filed Aug. 28, 2014, and designating the United States, which claims priority to U.S. Provisional application No. 62/010,710, filed Jun. 11, 2014, the disclosures of which are incorporated by reference herein.

TECHNICAL FIELD

Disclosed herein are, for example, an apparatus and method for digital beam-forming with low-resolution quantization.

BACKGROUND

Very large antenna array systems, such as multiple input multiple output, MIMO, systems, provide the opportunity for spatial division multiple access, SDMA, in which each individual user may be served with the same time-frequency resource as other users. This multiple access technique requires accurate and coherent control of both amplitude and phase over the antenna array, which is an issue often solved by the use of high speed, high resolution digital to analog converters, DACs.

FIG. 2 shows an antenna arrangement 200 using a fully digital beam-forming scheme, which requires one high resolution DAC per antenna-branch, shown in FIG. 2 as "High Res DAC". The respective output signals from the DACs are processed by mixers fed by a signal from an oscillator, OSC, and amplified by power amplifiers, PA, before being transmitted via antenna elements. FIG. 2 illustrates the case of a 4-dimensional antenna array, i.e., an antenna array with four antenna elements, but the concept is readily extendable to an arbitrary number N>1 of antenna elements.

High speed, high resolution DACs tend to consume a significant amount of power. For some example DAC circuits, every added bit, i.e., increase in DAC resolution, doubles the chip-area and the power consumption of the DAC. State-of-the-art high speed and high resolution DACs capable of running at high bandwidths usually consume power in the range of 1-2 Watts, which, when multiplied by the number of antenna elements in a large antenna arrangement, can result in a power consumption on the order of several hundreds of Watt's.

A power-conserving alternative to the fully digital beam-forming scheme discussed in connection to FIG. 2 is analogue beam-forming. FIG. 3 shows an antenna arrangement 300 with an analog beam-forming mechanism using phase-shifters, F, which in turn are controlled by a pre-coder that outputs control voltages $c1, c2, c3, c4$.

Analog beam-formers, such as the one 300 illustrated in FIG. 3, often comprise either passive structures such as a Butler matrices which constrains the spatial duplexing into a number of fixed beams, or analogue phase-shifters, which requires advanced calibration, since these usually comprise nonlinear analogue components. Further, analog phase-shifters do not provide means for control of the amplitude of the respective output signals. In order to provide beam-forming with amplitude control of the different antenna signals, either the PAs need to be able to provide fine-grained amplitude control, or an additional set of amplifiers are needed in the design. Both of which options add to the complexity of the antenna arrangement.

Consequently, some present antenna arrangements configured for digital beam-forming of a transmit signal either consume significant amounts of power, or are constrained in their spatial duplexing ability.

SUMMARY

An object of the present disclosure is to provide at least an antenna arrangement, a network node, and methods which seek to mitigate, alleviate, or eliminate one or more of the above-identified deficiencies in the art and disadvantages singly or in any combination.

This object is obtained by an antenna arrangement configured for digital beam-forming of a transmit signal. The antenna arrangement comprises a number N>1 of digital to analog converters, DACs. Each of the N DACs is arranged to receive one respective digital transmit signal component, and to convert and output an analog transmit signal component. Each of the N DACs has a respective resolution below a resolution required to fulfill a regulatory radio requirement in an interchangeable antenna arrangement arranged for transmission by a single antenna element connected to a single DAC. The antenna arrangement also comprises N antenna elements. Each of the N antenna elements is configured to receive one respective analog transmit signal component and to transmit the analog transmit signal component as part of the digitally beam-formed transmit signal.

In this way, the overall power consumption of the antenna arrangement is reduced due to the use of DACs with reduced resolution. Thus, a more power efficient antenna arrangement is provided.

Also, the present antenna arrangement provides for more flexibility compared to the use of analogue phase-shifters and/or Butler-matrices, leading to improved spatial resolution for beam-forming and/or beam-tracking.

Furthermore, there is by the present technique a reduced need for a large oversampling ratio, OSR, compared to using low resolution DAC's and low-order MIMO.

According to an aspect, the antenna arrangement further comprises a de-correlator arranged to receive N correlated digital transmit signal components, and to de-correlate quantization errors in the N correlated digital transmit signal components, and to output N digital transmit signal components to the respective N DACs.

The de-correlator reduces correlation between distortion components in the transmitted analog transmit signal components. In this way signal distortion from the different antenna branches averages out at a receiver of the transmitted signal and consequently improved transmission conditions are obtained.

According to a further aspect, the de-correlator comprises N dithering units. Each of the N dithering units is configured to receive a respective correlated digital transmit signal component, to add a dithering sequence to the received correlated digital transmit signal component, and to output a digital transmit signal component based on the added dithering sequence and the received correlated digital transmit signal component to a respective DAC.

Thus, on average, the low resolution DAC's are causing less interference due to the dithering sequences, since the dithering sequences serve to de-correlate quantization errors in the N correlated digital transmit signal components.

The object is also obtained by a method, performed in an antenna arrangement configured for digital beam-forming of a transmit signal. The method comprises converting, by a number N>1 of digital to analog converters, DACs, N digital transmit signal components into N respective analog transmit signal components. The converting is here performed at a respective resolution below a resolution required to fulfill a regulatory radio requirement in an interchangeable antenna arrangement arranged for transmission by a single antenna element connected to a single DAC. The method also comprises transmitting the N analog transmit signal components via N antenna elements as a digitally beam-formed transmit signal.

There is further provided herein computer programs comprising computer program code which, when executed in an antenna arrangement, causes the antenna arrangement to execute a method according to aspects disclosed herein.

The computer programs and the methods display advantages corresponding to the advantages already described in relation to the antenna arrangement.

BRIEF DESCRIPTION OF THE DRAWINGS

Further objects, features, and advantages of the present disclosure will appear from the following detailed description, wherein some aspects of the disclosure will be described in more detail with reference to the accompanying drawings, in which.

DETAILED DESCRIPTION

Figure 1:
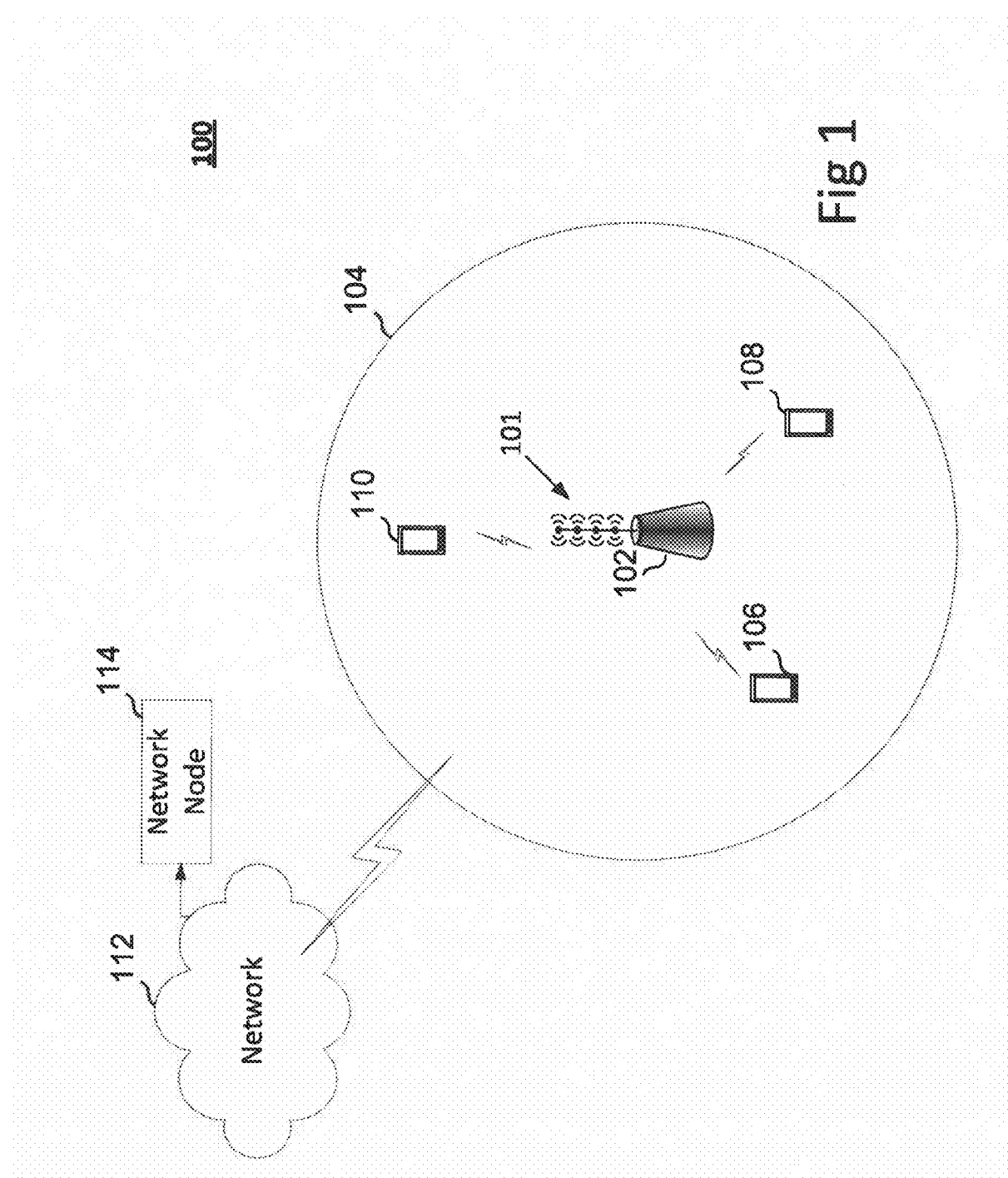
FIG. 1 illustrates an exemplary wireless communication system according to some aspects.

The present teaching makes use of the scaling of consumed power of a DAC which occurs when reducing the resolution of the DAC, i.e., the number of bits, along with the "massiveness" of advanced large antenna arrays in order to reduce the overall power consumption of the antenna arrangement and still deliver a high fidelity link with low error vector magnitude, EVM, in receivers such as user equipment, UE, or other wireless devices.

The decreased resolution in terms of DAC bits further has a positive effect on the possibilities of integration of the antenna array, since the physical DAC chip-size may be reduced down to a fraction of its high resolution counterpart.

The increased interference and unwanted signal emissions, such as out-of-band emission, caused by the increase in quantization noise may be averaged not only over time and frequency, but also over space due to the spatial selectivity of beam-forming antenna arrays. This averaging effect is, according to aspects of the present teaching, further enhanced by the introduction of independent dithering sequences at each DAC.

Aspects of the present disclosure will now be described more fully with reference to the accompanying drawings. The devices, computer programs and methods disclosed herein can, however, be realized in many different forms and should not be construed as being limited to the aspects set forth herein. Like numbers in the drawings refer to like elements throughout.

FIG. 1 illustrates aspects of a wireless communication system 100, which includes user equipments, UEs, i.e., wireless devices 106, 108, and 110 in communication with base station 102. Base station 102 provides coverage for cell 104. The base station 102 is in communication with a control node or network node 114 via a network 112. The network node 114 may be any network node such as a Radio Network Controller, RNC, a Mobility Management Entity, MME, a Mobile Switching Center, MSC, or Base Station Subsystem, BSS. The base station 102, according to aspects, operates using space division multiple access, SDMA, where, if the distance between the wireless devices 106, 108, and 110 is more than a minimum distance, the base station may reuse the same time-frequency resource for more than one wireless device.

Occasionally, herein, the non-limiting term UE is used. The UE herein can be any type of wireless device capable of communicating with a network node or another UE over radio signals. The UE may also be a radio communication device, target device, device to device, D2D UE, machine type UE or UE capable of machine to machine communication, M2M, a sensor equipped with UE, iPad, tablet, mobile terminal, smart phone, laptop embedded equipped, LEE, laptop mounted equipment, LME, USB dongles, Customer Premises Equipment, CPE etc.

Also, according to some aspects, generic terminology such as "radio network node" or simply "network node" is used. The network node can be any kind of network node which may comprise a base station, radio base station, base transceiver station, base station controller, network controller, evolved Node B, eNB, Node B, relay node, access point, radio access point, Remote Radio Unit, RRU, Remote Radio Head, RRH, etc.

The various aspects herein are described using LTE concepts. However, the aspects are applicable to any radio access technology, RAT, or multi-RAT system, e.g., LTE FDD/TDD, WCDMA/HSPA, GSM/GERAN, Wi Fi, CDMA2000 etc.

Figure 2:
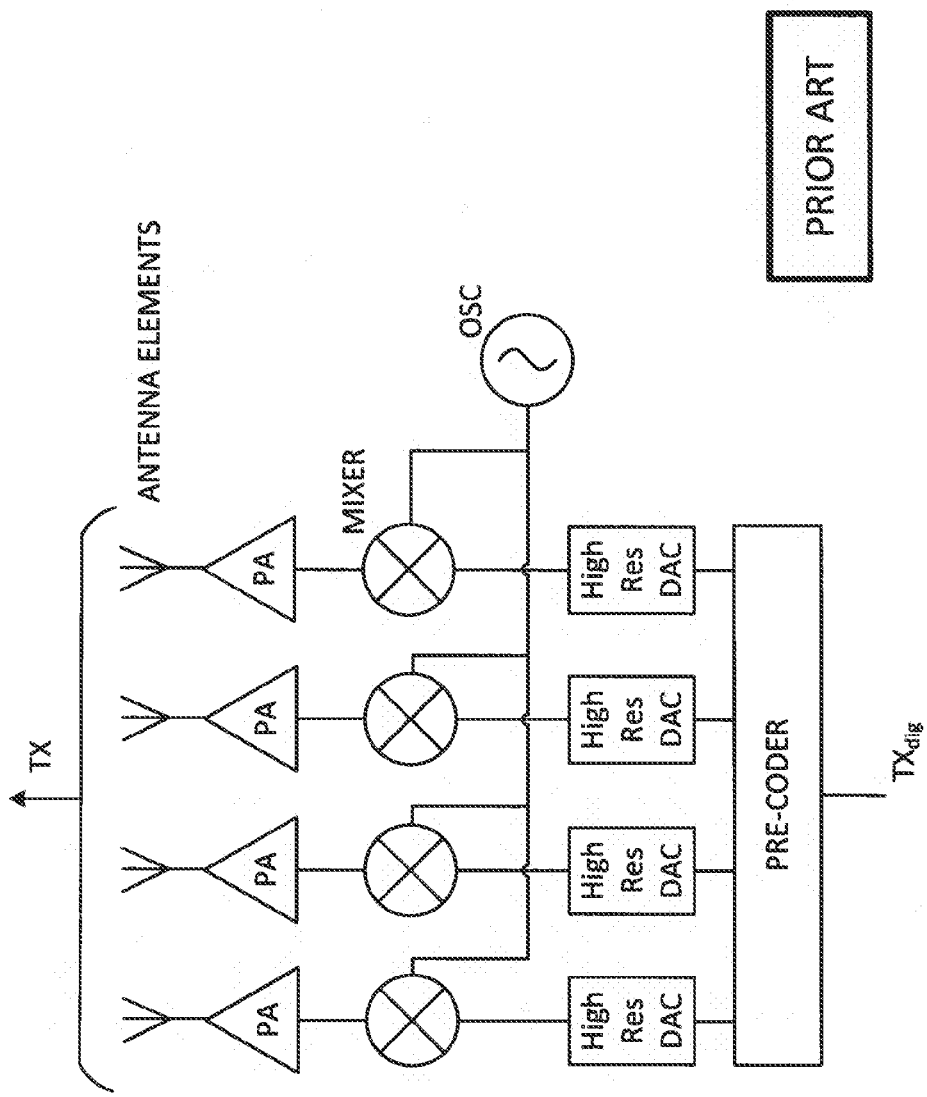
FIG. 2 illustrates an antenna arrangement with high-resolution DACs according to prior art.

FIG. 2 shows an antenna arrangement 200 using a fully digital beam-forming scheme according to prior art.

Figure 3:
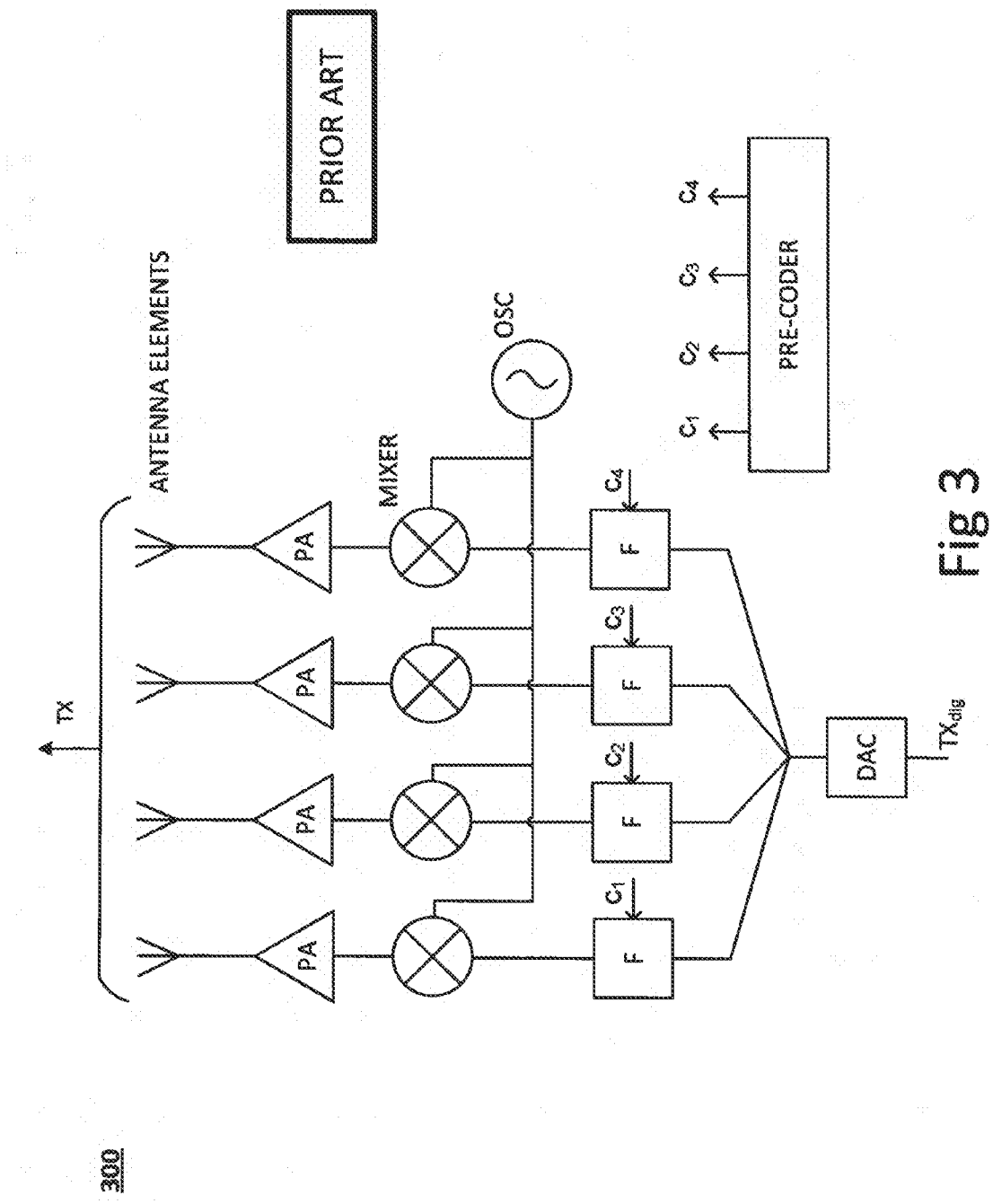
FIG. 3 illustrates an antenna arrangement with analog phase-shifters according to prior art.

FIG. 3 shows an antenna arrangement 300 with an analog beam-forming mechanism according to prior art.

FIGS. 2 and 3 were discussed above in the background section and will not be further described here.

Figure 4:
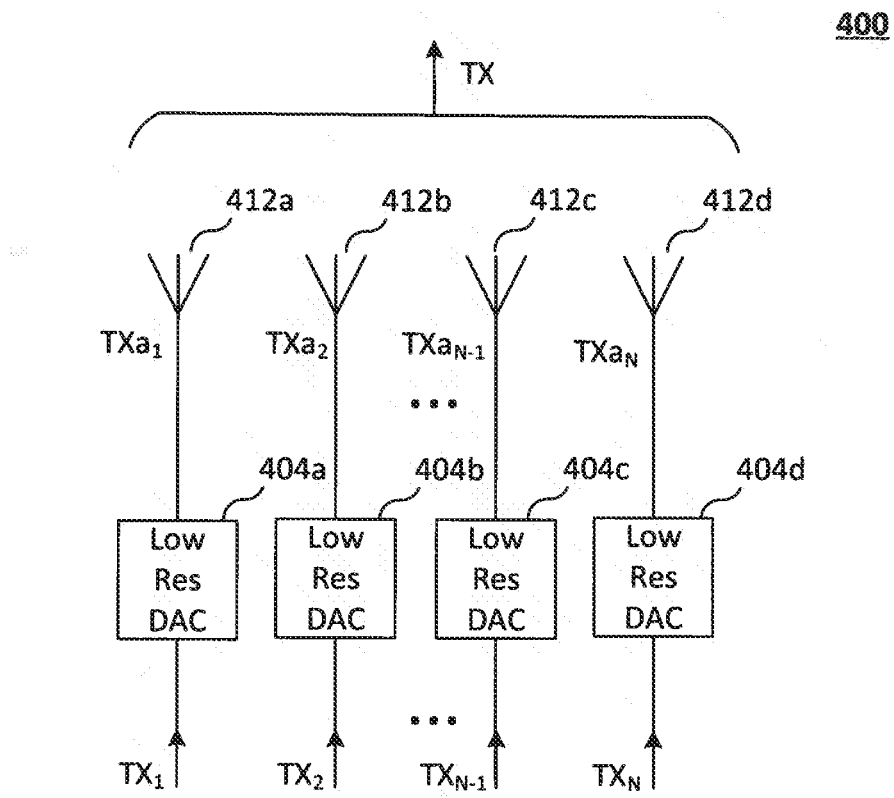
FIGS. 4-8 illustrate antenna arrangements according to aspects of the present teaching.

FIG. 4 shows an antenna arrangement 400 configured for digital beam-forming of a transmit signal TX. The antenna arrangement 400 comprises a number N>1 of digital to analog converters, DACs, 404a-404d. Each of the N DACs is arranged to receive one respective digital transmit signal component $TX_i$, i=1, 2, ..., N, and to convert and output an analog transmit signal component $TXa_i$, i=1, 2, ..., N.

As opposed to, e.g., the antenna arrangement 200 shown in FIG. 2, each of the N DACs here has a respective resolution below the resolution required to fulfill a regulatory radio requirement in an interchangeable antenna arrangement arranged for transmission by a single antenna element connected to a single DAC.

This means that, on their own, each of the DACs of the antenna arrangement 400 has too low resolution in order to generate a clean enough signal for use in, e.g., a telecommunications system such as the system 100 illustrated in FIG. 1. However, because a number N>1 of low resolution DACs are used in an antenna array, the aggregate transmit signal TX will still fulfil radio requirements when received at a given receiver.

The antenna arrangement 400 shown in FIG. 4 further comprises N antenna elements 412a-412d. Each of the N antenna elements is configured to receive one respective analog transmit signal component $TXa_i$, i=1, 2, ..., N, and to transmit the analog transmit signal component as part of the digitally beam-formed transmit signal TX.

The antenna arrangement 400 shown in FIG. 4, according to aspects, comprises a large number of antenna branches, i.e., DACs and antenna elements. Thus, the four antenna branches shown, e.g., in FIGS. 4-8 herein is merely an example number of antenna branches, and the present teaching is readily extendable to any number N>1 of antenna branches.

According to some aspects, the advantageous effects of the present teaching, at least in terms of received signal quality and consumed power, increases with the number of antenna elements N. Thus, the antenna arrangement 400 makes use of the beneficial scaling of the consumed power of a DAC which occurs when reducing the resolution of the DAC, i.e., the number of bits, and the "massiveness" of large antenna arrays in order to reduce the overall power consumption of the antenna arrangement and still deliver a high fidelity link with low error vector magnitude, EVM, in receivers such as user equipment, UE, or other wireless devices.

Herein, what constitutes a "low resolution DAC" is to be interpreted in a broad and relative sense. That is, no specific resolution in terms of number of bits need necessarily be used to define high and low resolution. Rather, a high resolution DAC is here interpreted as being a DAC with specification such that the DAC, on its own, is capable of generating a signal which fulfils some regulatory radio requirement, e.g., as defined in a 3GPP standard such as the specification document TS 36.104 V12.3.0. A low resolution DAC, on the other hand, is a DAC with insufficient resolution to be used on its own.

The particular regulatory radio requirement referred to above varies according to aspects of the present teaching, from requirements on, e.g., error vector magnitude, EVM, at a receiver of the transmitted signal TX to requirements on adjacent channel power ratio, ACPR, and oversampling ratios, OSR.

Thus, according to some aspects, the regulatory radio requirement comprises one or more requirements on an adjacent channel power ratio, ACPR, of the antenna arrangement 101, 400.

According to some other aspects, the regulatory radio requirement corresponds to one or more radio performance requirements defined by third Generation Partnership Project, 3GPP, specification document TS 36.104 V12.3.0.

The DACs 404a-404d shown in FIG. 4 need not necessarily be of the same resolution. Hence, according to some aspects, one or more of the N DACs 404a-404d has a resolution different from one or more other DACs 404a-404d comprised in the antenna arrangement 400.

The antenna arrangement shown in FIG. 4 is, according to some aspects, comprised in a network node such as the base station 102 shown in FIG. 1.

Figure 5:
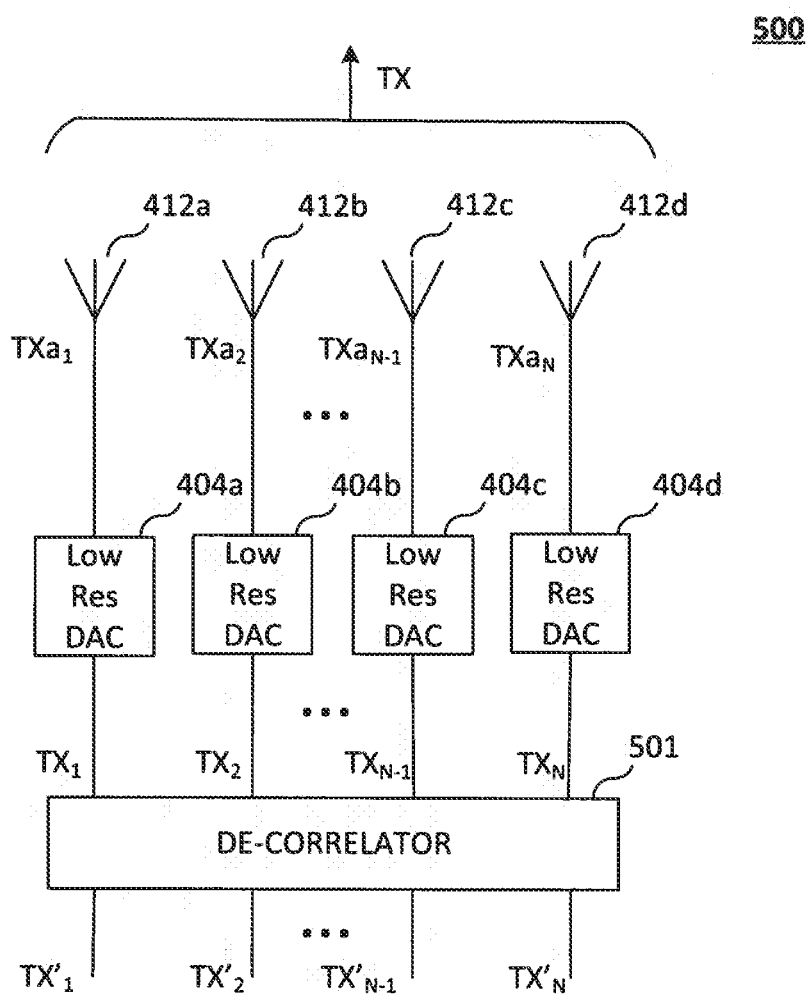

FIG. 5 shows an antenna arrangement 500 comprising a de-correlator 501 arranged to receive N correlated digital transmit signal components $TX'_i$, i=1, 2, ..., N, to de-correlate quantization errors in the N correlated digital transmit signal components, and to output N digital transmit signal components $TX_i$, i=1, 2, ..., N to the respective N DACs 404a404d.

Thus, the de-correlator reduces correlation between distortion components, such as quantization errors, in the transmitted analog transmit signal components. In this way signal distortion from the different antenna branches averages out at a receiver of the transmitted signal and consequently improved transmission conditions are obtained.

Consequently, the de-correlator 501, according to aspects, increases the performance of the antenna arrangement 500 compared to the antenna arrangement 400 in that an aggregate error vector at a receiver of the beam-formed transmit signal TX now has uncorrelated distortion components with zero mean value and without bias. That is, suppose the transmitted signal is TX=s+e, where s is the payload signal vector and e is an error vector dominated by DAC artefacts due to the reduced DAC resolution, wherein the number of elements in s and e correspond to the number of antenna elements. Suppose further that a transmission channel between the antenna arrangement 500 and a receiver of the beam-formed transmit signal TX can be modelled by a channel matrix H. The received signal is then essentially given by y=H(s+e)+w=Hs+He+w, where w is distortion vector added at the receiver, such as receiver noise.

Now, for a large antenna array, the length of vector e is significantly larger than the length of vector y. Thus, when matrix H multiplies vector e, a weighted summation of the elements in e occurs. Consequently, if the elements of e are uncorrelated and zero mean, the power of the term He will be small, i.e., a beneficial effect is obtained from averaging over vector e as long as the elements in vector e are uncorrelated and have zero mean. The de-correlator 501 provides this beneficial feature.

Figure 6:
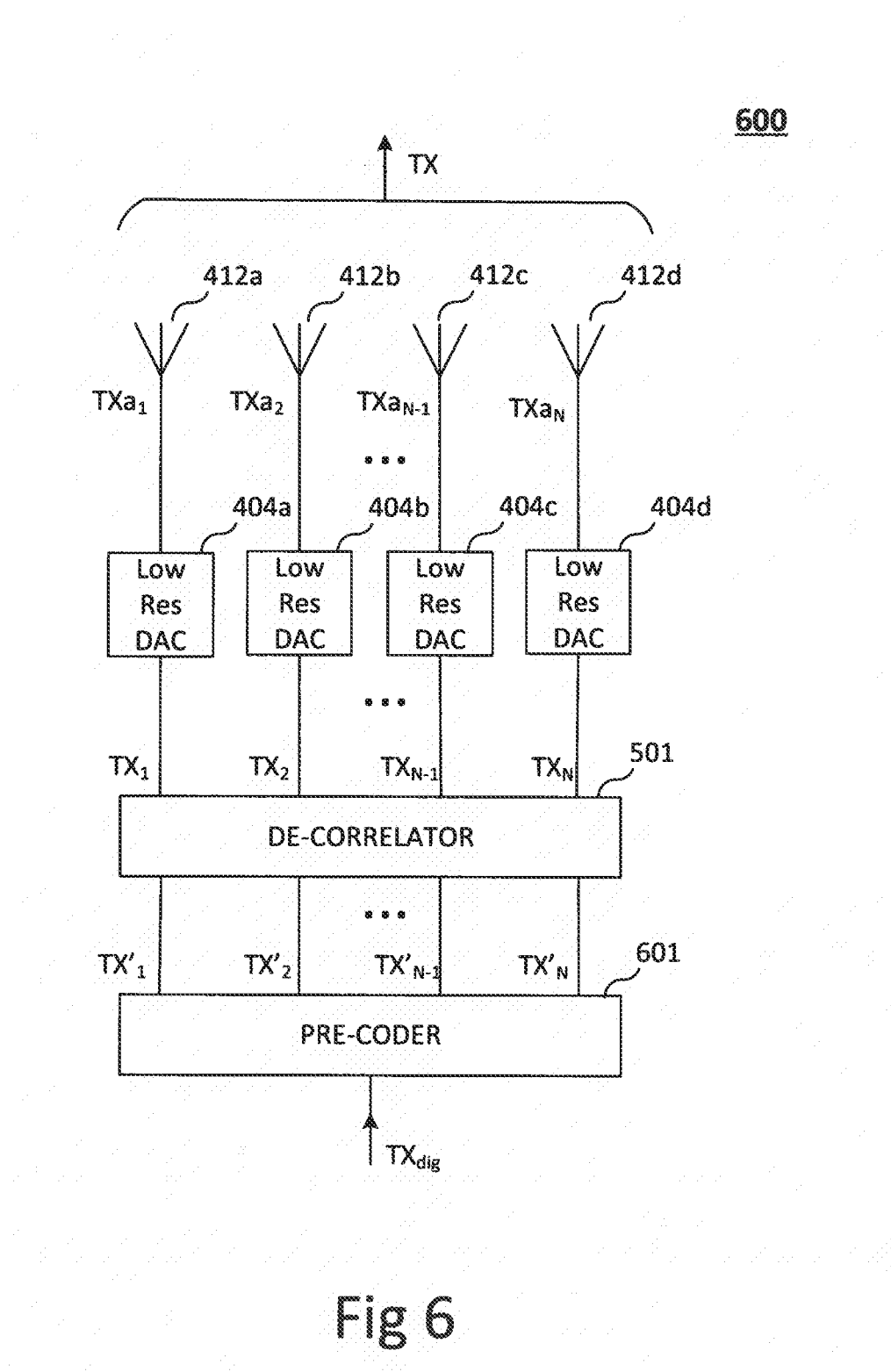

FIG. 6 shows an antenna arrangement 600 further comprising a pre-coder 601 arranged to receive a common digital transmit signal vector $TX_{dig}$, to pre-code the common digital transmit signal into N correlated digital transmit signal components $TX'_i$, i=1, 2, ..., N, and to output N correlated digital transmit signal components $TX'_i$, i=1, 2, ..., N, to the de-correlator 501.

The pre-coder 601, according to some aspects, acts as an encoder. The pre-coder 601 then generates a digital sequence for each antenna branch. The digital sequence may be a sequence of bits that are associated with a beam direction.

According to some aspects, the de-correlator 501 is comprised within the pre-coder 601. Thus, the pre-coder 601 and the de-correlator 501 need not necessarily be separate modules as shown in FIG. 6.

According to some other aspects, the common digital transmit signal vector $TX_{dig}$ is a multi-user signal, meaning that one or more separate user signals are comprised in the common digital transmit signal vector $TX_{dig}$. Each separate user signal is, according to aspects, beamformed using a respective set of beam-forming weights, i.e., antenna element amplitudes and phases.

Figure 7:
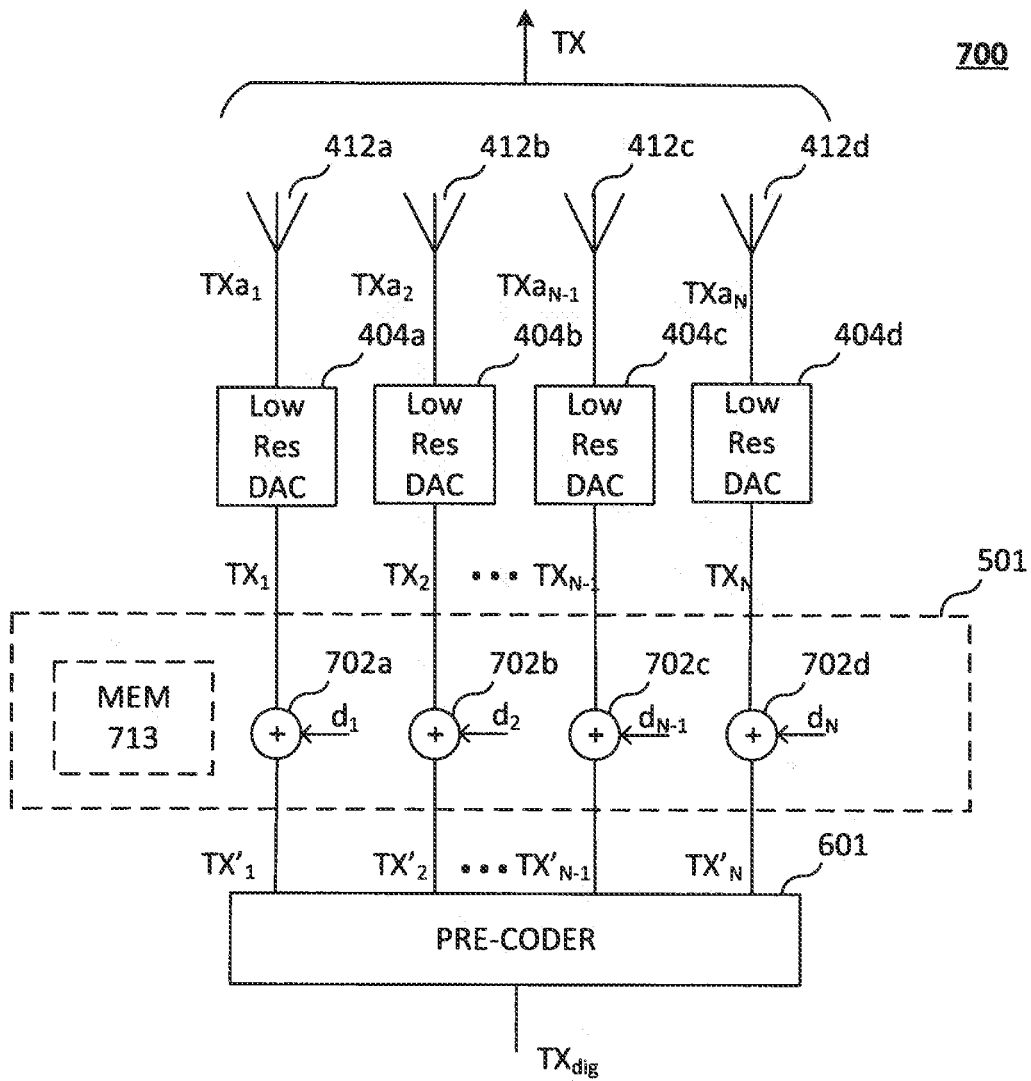

FIG. 7 illustrates an antenna arrangement 700 wherein the de-correlator 501 comprises N dithering units 702a-702d. Each of the N dithering units is configured to receive a respective correlated digital transmit signal component $TX'_i$, to add a dithering sequence $d_i$ to the received correlated digital transmit signal component, and to output a digital transmit signal component $TX_i$ based on the added dithering sequence $d_i$ and the received correlated digital transmit signal component $TX'_i$ to a respective DAC 404a-404d.

The dithering sequences can be generated in real time, or stored in a memory, MEM 713. Thus, according to some aspects, one or more of the respective dithering sequences $d_i$=1, 2, ..., N comprises one out of a number of pre-determined periodic sequences stored in a memory device, MEM 713, of the de-correlator 501.

The actual dithering sequences vary according to different aspects of the present teaching.

Thus, according to aspects, one or more of the respective dithering sequences $d_i$, i=1, 2, ..., N comprises a dithering sequence independent from one or more other dithering sequences of the de-correlator 501. In this way at least part of the dithering sequences $d_i$, i=1, 2, ..., N are statistically independent of each other.

According to other aspects, one or more of the dithering sequences $d_i$, i=1, 2, ..., N are uniformly distributed over an interval corresponding to −LSB/2 to LSB/2, where LSB denotes a signal amplitude corresponding to the least significant bit of one or more DACs 404a-404d comprised in the antenna arrangement 700.

According to further aspects, one or more of the dithering sequences $d_i$, i=1, 2, ..., N are distributed according to a normal distribution with zero mean and a pre-determined standard deviation substantially equaling LSB/2, where LSB denotes a signal amplitude corresponding to the least significant bit of one or more DACs 404a-404d comprised in the antenna arrangement 700.

According to some aspects, one or more of the respective dithering sequences i=1, 2, ..., N comprises a pseudo-noise, PN, sequence.

According to some further aspects, one or more of the respective dithering sequences $d_i$, i=1, 2, ..., N comprises an additive white Gaussian noise, AWGN, sequence.

The use of low resolution DAC's with, in some aspects, either statistically independent or otherwise tailored, i.e., customized, dithering sequences provides advantages; The decreased DAC resolution improves the array power efficiency, while the dithering enables additional improvement of the received EVM and handling of interference caused by the increased quantization noise resulting from the decreased DAC resolution.

Figure 8:
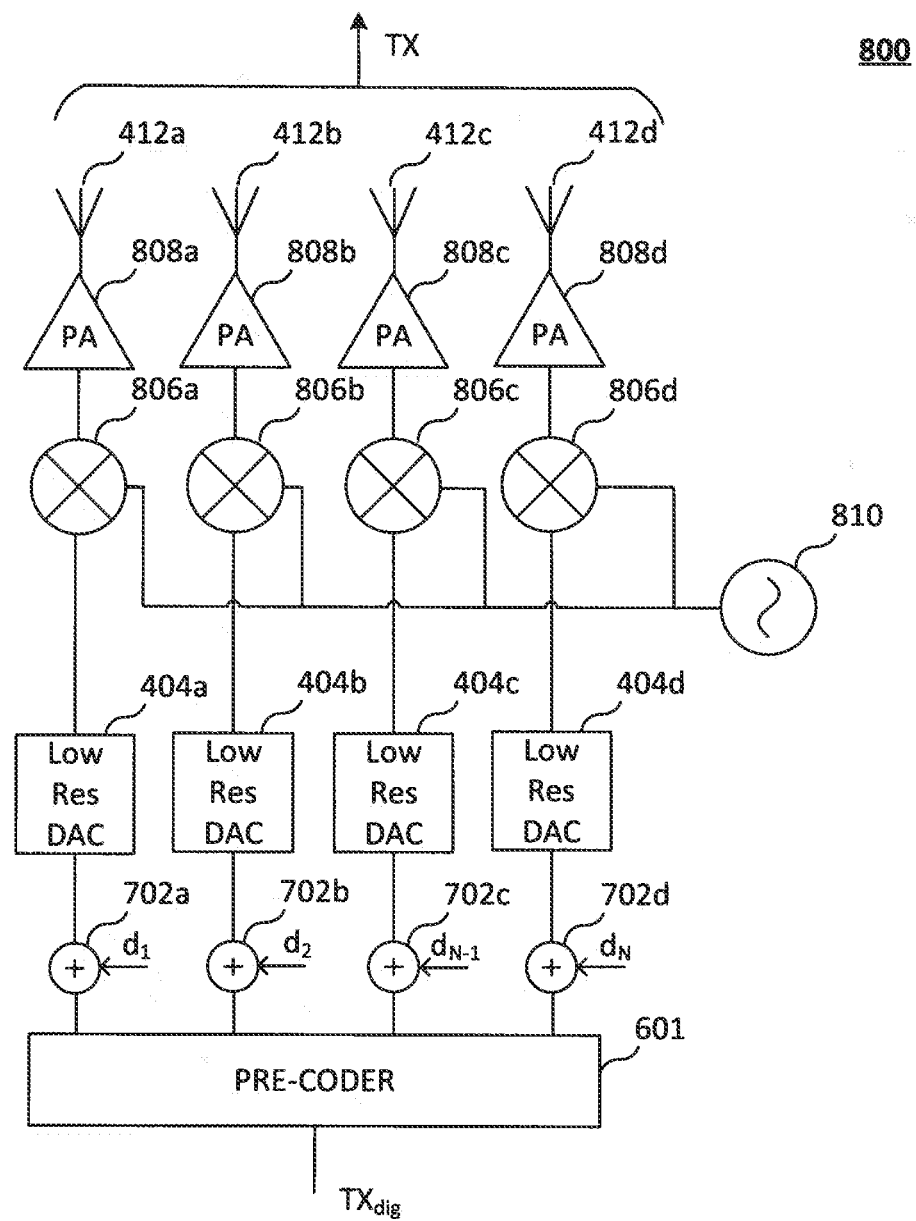

FIG. 8 illustrates aspects of an antenna arrangement 800 included in the base station 102. The antenna arrangement 800 may use a fully digital beam-forming scheme with a low resolution DAC 404a-404d at each branch which is preceded by independently generated dithering sequences $d_i$, i=1, 2, ..., N. The dithering sequences may be independent and uniformly distributed over the resolution of the DAC such as −LSB/2 to +LSB/2. The dithering sequences, which are statistically independent from branch to branch, may be generated using a standard random number generator. While FIG. 8 illustrates a 4-dimensional array, the antenna array is readily extendable to an arbitrary number N of antennas.

According to some aspects, the antenna arrangement includes a pre-coder 601 that acts as an encoder. The pre-coder 601 may generate a digital sequence for each antenna branch. The digital sequence may be a sequence of bits that are associated with a beam direction. A respective dithering sequence $d_i$ may be applied 702a-702d to each digital sequence for each antenna branch. Each antenna branch may include a respective low-resolution DAC 404a-404d that receives a corresponding digital sequence and converts the digital sequence to an analog signal. Each antenna branch may further include modulators such as mixers 806a-806d that modulate a corresponding analog signal to a predetermined frequency in accordance with a sinusoidal signal received from an oscillator 810. Each antenna branch may also include one or more antennas 412a-412d for transmitting signals to one or more UEs.

Aspects combine the use of low resolution DAC's with either statistically independent or otherwise tailored (i.e., customized) dithering sequences. The decreased DAC resolution improves the array power efficiency, while the dithering enables additional improvement of the received EVM and handling of interference caused by the increased quantization noise resulting from the decreased DAC resolution.

FIGS. 5-8 show the de-correlator 502 or the dithering units 702a-702d upstream from the DACs 404a-404d, i.e., the transmitted signal is first de-correlated and then converted into analog domain. It is, however, appreciated that the opposite order of processing is also possible. Consequently, an antenna arrangement where a digital transmit signal is first converted into analog transmit signal components and then de-correlated in analog domain is, according to some aspects, disclosed herein.

Figure 9:
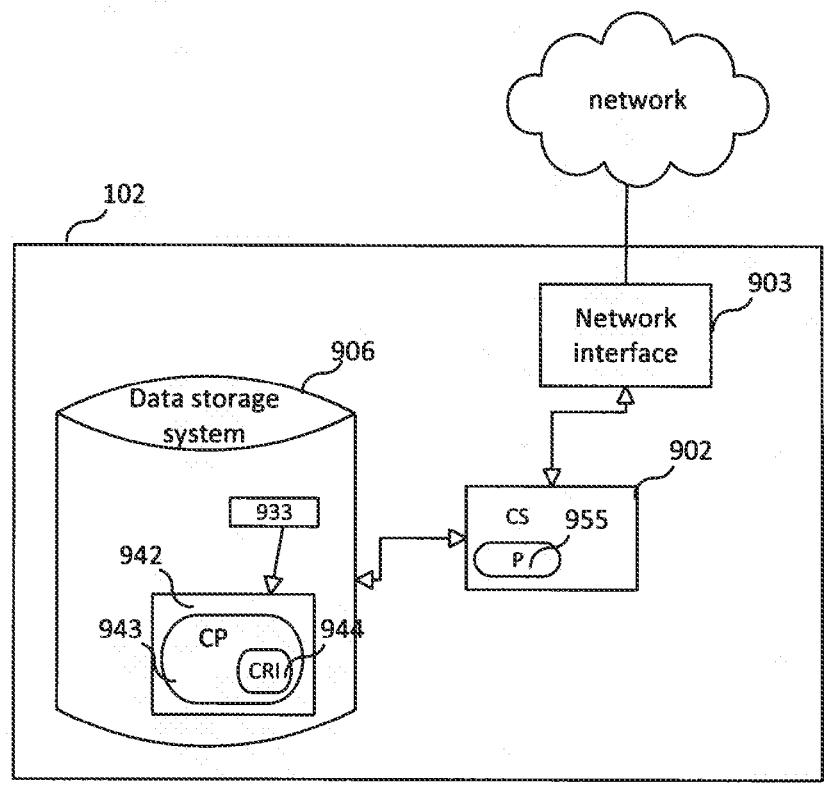
FIG. 9 is a block diagram of a base station according to some aspects.

FIG. 9 is a block diagram of an embodiment of base station 102. As shown in FIG. 9, base station 102 may include or consist of: a computer system, CS, 902, which may include one or more processors 955, e.g., a general purpose microprocessor and/or one or more circuits, such as an application specific integrated circuit, ASIC, field-programmable gate array, a logic circuit, and the like; a network interface 903 for use in connecting base station 102 to a network; and a data storage system 906, which may include one or more non-volatile storage devices and/or one or more volatile storage devices, e.g., random access memory, RAM. The CS 902 may be configured to perform the functionality of the encoder that generates a digital sequence. In aspects where base station 102 includes a processor 955, a computer program product, CPP, 933 may be provided. CPP 933 includes or is a computer readable medium, CRM, 942 storing a computer program, CP, 943 comprising computer readable instructions, CRI, 944. CRM 942 is a non-transitory computer readable medium, such as, but not limited, to magnetic media (e.g., a hard disk), optical media (e.g., a DVD), solid state devices (e.g., random access memory, flash memory), and the like. In some aspects, the CRI 944 of computer program 943 is configured such that when executed by computer system 902, the CRI causes the base station 102 to perform steps described below, e.g., steps described below with reference to the flow charts and message flows shown in the drawings. In other aspects, base station 102 may be configured to perform steps described herein without the need for a computer program. That is, for example, computer system 902 may consist merely of one or more ASICs. Hence, the features of the aspects described herein may be implemented in hardware and/or software.

The aspects provide overall reduced power consumption compared to the use of high resolution DAC's, resulting in a more efficient antenna array. The aspects further provide more flexibility compared to the use of analogue phase-shifters/Butler-matrices, leading to improved spatial resolution for beam-forming/beam-tracking. The aspects further remove the need for high OSR compared to using low resolution DAC's and low-order MIMO. Furthermore, the interference of the low resolution DAC is reduced with the dithering sequences.

Figure 10:
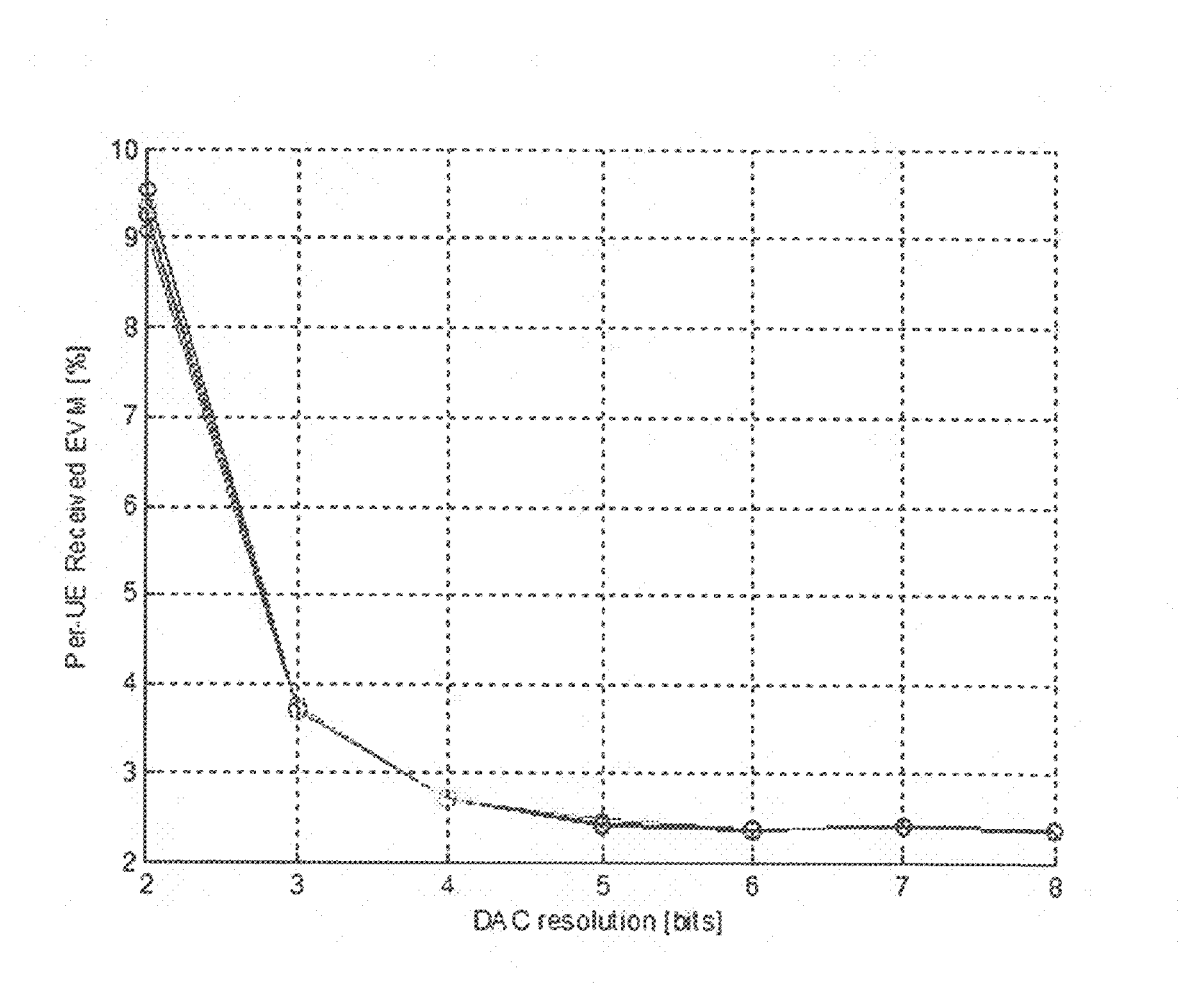
FIG. 10 is a chart illustrating an error vector magnitude, EVM, vs. DAC resolution.
Figure 11:
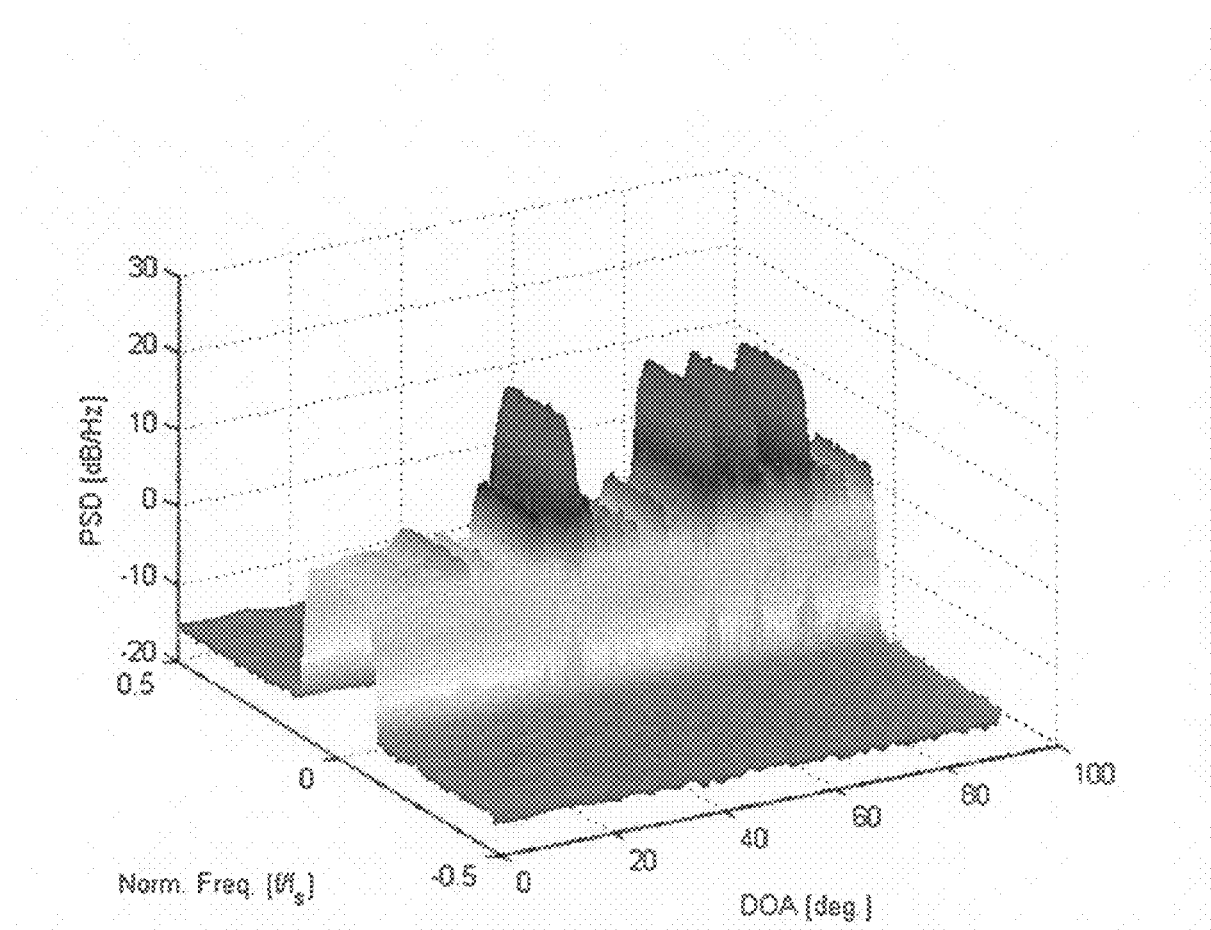
FIG. 11 is a power spectral density, PSD, graph.

FIGS. 10 and 11 illustrate the results of simulations using the antenna arrays and antenna arrangements of the present teaching. FIG. 10 is a chart that illustrates the trade-off between received EVM versus the number of DAC bits. As illustrated in FIG. 10, as the number of DAC bits is increased, the reduction in the EVM rapidly reaches saturation, where the EVM is limited by other factors such as phase-noise, power amplifier nonlinearities, etc. For example, as illustrated in FIG. 10, the saturated level of EVM is essentially reached using 5 bits for the DAC resolution.

FIG. 11 is a power spectral density, PSD, graph that shows the transmitted PSD versus frequency versus direction of arrival, DOA. As illustrated in FIG. 11, the out of band/out of angle emissions is averaged by the dithering, creating a reduced and uniform distribution over frequency and space.

Figure 12:
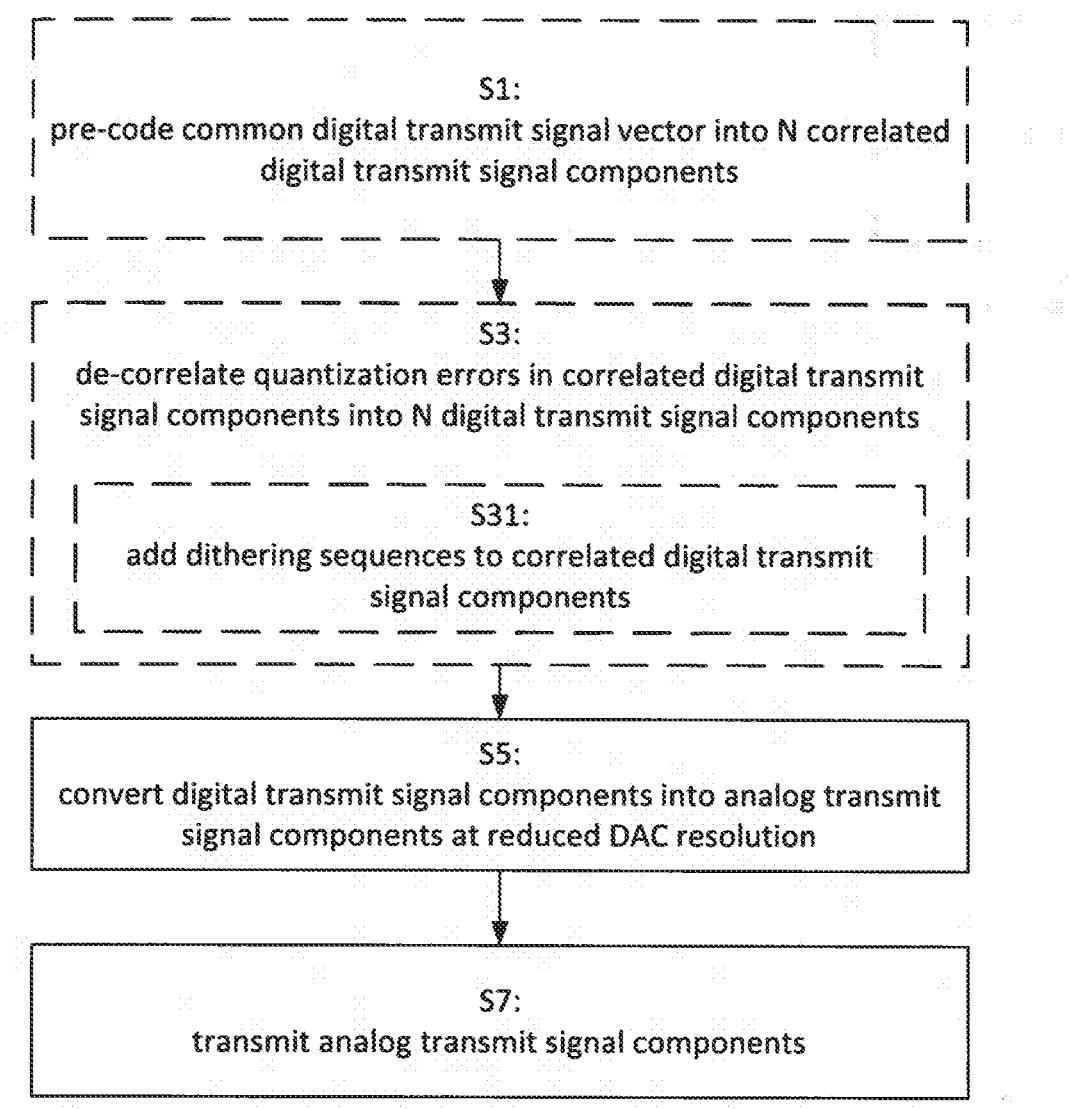
FIG. 12 is a flowchart illustrating aspects of method steps performed in an antenna arrangement.

FIG. 12 is a flowchart illustrating aspects of method steps performed in an antenna arrangement. In particular, there is illustrated a method, performed in an antenna arrangement 101, 400, 500, 600, 700, 800 configured for digital beamforming of a transmit signal TX. The method comprises converting S5, by a number N>1 of digital to analog converters, DACs, 404a-404d, N digital transmit signal components $TX_i$, i=1, 2, ..., N, into N respective analog transmit signal components $TXa_i$, i=1, 2, ..., N. The converting being performed at a respective resolution below a resolution required to fulfill a regulatory radio requirement in an interchangeable antenna arrangement arranged for transmission by a single antenna element connected to a single DAC.

The method also comprises transmitting S7 the N analog transmit signal components $TXa_i$, i=1, 2, ..., N, via N antenna elements 412a-412d as a digitally beam-formed transmit signal TX.

According to some aspects, the method further comprises de-correlating S3 quantization errors in a number N>1 of correlated digital transmit signal components $TX'_i$, i=1, 2, ..., N, into N digital transmit signal components $TX_i$, i=1, 2, ..., N.

According to aspects, the de-correlating S3 further comprises dithering S31, by N dithering units 702a-702d, each of the N correlated digital transmit signal components $TX'_i$, i=1, 2, ..., N, by adding a respective dithering sequence $d_i$ to each correlated digital transmit signal component.

According to further aspects, the method also comprises pre-coding S1 a common digital transmit signal vector $TX_{dig}$ into a number N>1 of correlated digital transmit signal components $TX'_i$, i=1, 2, ..., N.

Figure 13:
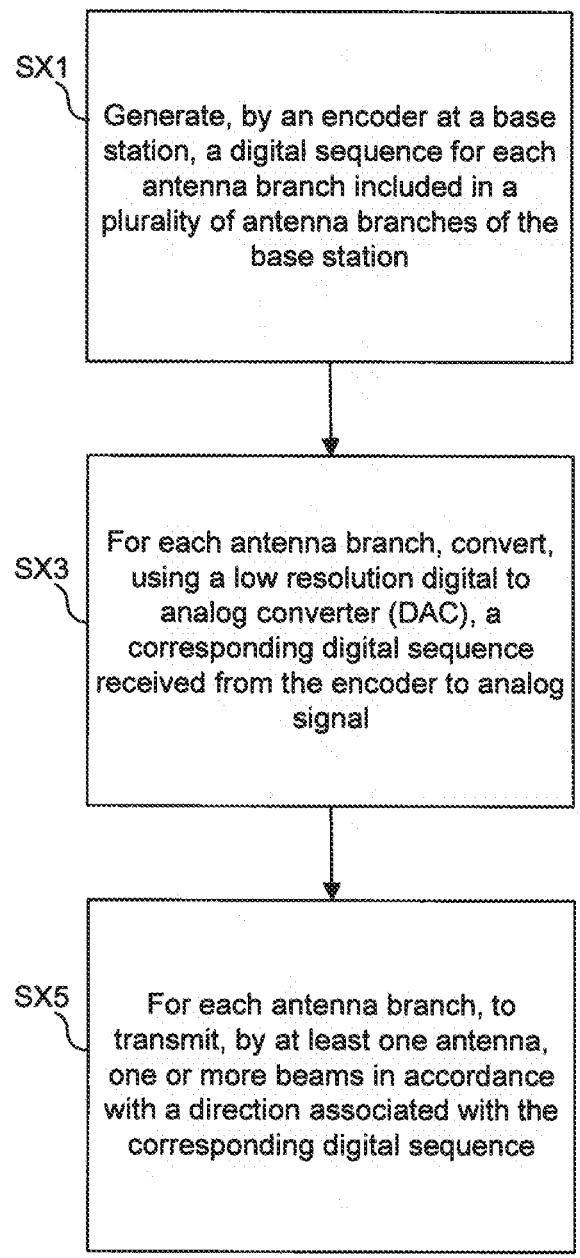
FIG. 13 is a flow chart illustrating a process according to some aspects of the present teaching.

FIG. 13 illustrates aspects of a process performed in a base station. The process may generally start at step SX1 to generate, by an encoder at the base station, a digital sequence for each antenna branch included in a plurality of antenna branches of the base station. The process proceeds to step SX3 to convert, using a low resolution DAC, a corresponding digital sequence received from the encoder to an analog signal. Step SX3 may be performed for each antenna branch. Furthermore, a dither sequence may be applied to the digital sequence prior to converting to the analog signal. The process proceeds to step SX5 to transmit, by at least one antenna, one or more beams in accordance with a direction associated with the corresponding digital sequence. Step SX5 may be performed for each antenna branch.

Additionally, there is also disclosed herein;

A base station comprising: a plurality of antenna branches; an encoder that generates a digital sequence for each antenna branch included in the plurality of antenna branches; and wherein each antenna branch includes: a low resolution digital to analog converter, DAC, 404a-404d, that converts a corresponding digital sequence received from the encoder to an analog signal, and at least one antenna 412a-412d that transmits one or more beams in accordance with a direction associated with the corresponding digital sequence.

According to aspects, a respective dithering sequence is applied to each digital sequence.

According to aspects, each respective dithering sequence is independently generated and uniformly distributed over the resolution of each DAC 404a-404d.

According to aspects, each respective dithering sequence is customized to the respective digital sequence.

According to aspects, each DAC 404a-404d has a resolution less than or equal to 8 bits.

According to aspects, each DAC 404a-404d has a resolution less than or equal to 5 bits.

According to aspects, each antenna branch further includes a signal modulator that modulates the analog signal to a predetermined frequency.

According to aspects, the base station transmits the one or more beams to one or more mobile stations in accordance with spatial division multiple access, SDMA.

Furthermore, according to some example embodiments, a base station includes a plurality of antenna branches. The base station further includes an encoder that generates a digital sequence for each antenna branch included in the plurality of antenna branches. Each antenna branch includes a low resolution DAC that converts a corresponding digital sequence received from the encoder to an analog signal. Each antenna branch further includes at least one antenna that transmits one or more beams in accordance with a direction associated with the corresponding digital sequence.

According to some other example embodiments, a method performed in a base station includes generating, by an encoder at the base station, a digital sequence for each antenna branch included in a plurality of antenna branches of the base station. For each antenna branch, the method includes converting, using a low resolution DAC at the base station, a corresponding statistically independent digital sequence received from the encoder to an analog signal. For each antenna branch, the method further includes transmitting, by at least one antenna, one or more beams in accordance with a direction associated with the corresponding digital sequence.

The description of the example embodiments provided herein have been presented for purposes of illustration. The description is not intended to be exhaustive or to limit example embodiments to the precise form disclosed, and modifications and variations are possible in light of the above teachings or may be acquired from practice of various alternatives to the provided embodiments. The examples discussed herein were chosen and described in order to explain the principles and the nature of various example embodiments and its practical application to enable one skilled in the art to utilize the example embodiments in various manners and with various modifications as are suited to the particular use contemplated. The features of the embodiments described herein may be combined in all possible combinations of methods, apparatus, modules, systems, and computer program products. It should be appreciated that the example embodiments presented herein may be practiced in any combination with each other.

It should be noted that the word "comprising" does not necessarily exclude the presence of other elements or steps than those listed and the words "a" or "an" preceding an element do not exclude the presence of a plurality of such elements. It should further be noted that any reference signs do not limit the scope of the claims, that the example embodiments may be implemented at least in part by means of both hardware and software, and that several "means", "units" or "devices" may be represented by the same item of hardware.

The various example embodiments described herein are described in the general context of method steps or processes, which may be implemented in one aspect by a computer program product, embodied in a computer-readable medium, including computer-executable instructions, such as program code, executed by computers in networked environments. A computer-readable medium may include removable and non-removable storage devices including, but not limited to, Read Only Memory, ROM, Random Access Memory, RAM, compact discs, CDs, digital versatile discs, DVD, etc. Generally, program modules may include routines, programs, objects, components, data structures, etc., that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The invention claimed is:

1. A power efficient first antenna arrangement configured for digital beam-forming of a transmit signal, the first antenna arrangement comprising;
   a number N>1 of digital to analog converters (DACs) including a first DAC and a second DAC, each of the N DACs being arranged to receive one respective digital transmit signal component, and to convert and output an analog transmit signal component; and
   N antenna elements, each of the N antenna elements being coupled to just one of the N DACs such that each of the N antenna elements is configured to receive the analog transmit signal component outputted by the DAC to which the antenna element is coupled, wherein the N antenna elements are further configured to generate a digitally beam-formed transmit signal by having each of the N antenna elements transmit the received analog transmit signal component as part of the digitally beam-formed transmit signal, wherein
   the first DAC is configured to have a first low resolution such that if the first DAC were used in a second antenna arrangement that utilized only one antenna element to transmit a first analog signal produced by the first DAC, then the first analog signal transmitted by the second antenna arrangement would not fulfill a regulatory radio requirement,
   the second DAC is configured to have a second low resolution such that if the second DAC were used in a third antenna arrangement that utilized only one antenna element to transmit a second analog signal produced by the second DAC, then the second analog signal transmitted by the third antenna arrangement would not fulfill said regulatory radio requirement, and
   said digitally beam-formed transmit signal fulfills said regulatory radio requirement.

2. The antenna arrangement according to claim 1, further comprising a de-correlator arranged to receive N correlated digital transmit signal components, to de-correlate quantization errors in the N correlated digital transmit signal components, and to output the N digital transmit signal components to the respective N DACs.

3. The antenna arrangement according to claim 2, further comprising a pre-coder arranged to receive a common digital transmit signal vector (TXdig), to pre-code the common digital transmit signal into N correlated digital transmit signal components, and to output N correlated digital transmit signal components to the de-correlator.

4. The antenna arrangement according to claim 2, wherein the de-correlator comprises N dithering units, each of the N dithering units being configured to receive a respective correlated digital transmit signal component (TX'i), to add a dithering sequence (di) to the received correlated digital transmit signal component, and to output a digital transmit signal component (TXi) based on the added dithering sequence (di) and the received correlated digital transmit signal component (TX'i) to a respective DAC.

5. The antenna arrangement according to claim 4, wherein one or more of the respective dithering sequences comprises a dithering sequence independent from one or more other dithering sequences of the de-correlator, at least part of the dithering sequences thus being statistically independent of each other.

6. The antenna arrangement according to claim 4, wherein one or more of the dithering sequences is uniformly distributed over an interval corresponding to $-LSB/2$ to $LSB/2$, where LSB denotes a signal amplitude corresponding to the least significant bit of one or more of the N DACs comprised in the antenna arrangement.

7. The antenna arrangement according to claim 4, wherein one or more of the dithering sequences is distributed according to a normal distribution with zero mean and a predetermined standard deviation substantially equaling $LSB/2$, where LSB denotes a signal amplitude corresponding to the least significant bit of one or more of the N DACs comprised in the antenna arrangement.

8. The antenna arrangement according to claim 4, wherein one or more of the dithering sequences comprises a pseudo-noise, PN, sequence.

9. The antenna arrangement according to claim 4, wherein one or more of the dithering sequences comprises an additive white Gaussian noise, AWGN, sequence.

10. The antenna arrangement according to claim 4, wherein one or more of the dithering sequences comprises one out of a number of pre-determined periodic sequences stored in a memory device of the de-correlator.

11. The antenna arrangement according to claim 1, wherein the regulatory radio requirement comprises one or more requirements on an adjacent channel power ratio (ACPR) of the antenna arrangement.

12. The antenna arrangement according to claim 1, wherein the regulatory radio requirement corresponds to one or more radio performance requirements defined by third Generation Partnership Project, 3GPP, specification document TS 36.104 V12.3.0.

13. The antenna arrangement according to claim 1, wherein one or more of the N DACs has a resolution different from one or more other DACs comprised in the antenna arrangement.

14. A network node comprising the antenna arrangement according to claim 1.

15. A method, performed in a first antenna arrangement, the method comprising;

employing N number of digital to analog converters (DACs), wherein N >1, such that each of the N DACs converts a respective digital transmit signal component to produce a respective analog signal component and outputs the respective analog transmit signal component; and using N antenna elements, N>1, to generate a digitally beam-formed transmit signal by having each one of the N antenna elements transmit one of the respective analog transmit signal components as part of the digitally beam-formed transmit signal, wherein the N number of DACs includes a first DAC and a second DAC, the first DAC is configured to have a first low resolution such that if the first DAC were used in a second antenna arrangement that utilized only one antenna element to transmit a first analog signal produced by the first DAC, then the first analog signal transmitted by the second antenna arrangement would not fulfill a regulatory radio requirement, the second DAC is configured to have a second low resolution such that if the second DAC were used in a third antenna arrangement that utilized only one antenna element to transmit a second analog signal produced by the second DAC, then the second analog signal transmitted by the third antenna arrangement would not fulfill said regulatory radio requirement, and said digitally beam-formed transmit signal fulfills said regulator radio requirement.

16. The method according to claim 15, further comprising;

de-correlating quantization errors in N correlated digital transmit signal components to generate the N digital transmit signal components.

17. The method according to claim 16, the de-correlating further comprising;

dithering, by N dithering units, each of the N correlated digital transmit signal components by adding a respective dithering sequence (di) to each correlated digital transmit signal component.

18. The method according to claim 16, further comprising;

pre-coding a common digital transmit signal vector into a number N>1 of correlated digital transmit signal components.

19. A computer program product comprising a non-transitory computer readable medium storing computer program code for performing the method of claim 15.

20. The first antenna arrangement of claim 1, wherein the N antenna elements include a first antenna element and a second antenna element, the first antenna arrangement further comprises N mixers including a first mixer and a second mixer, the first antenna element is coupled to the first DAC via the first mixer, and the second antenna element is coupled to the second DAC via the second mixer.

21. The first antenna arrangement of claim 1, wherein the regulatory requirement is an error vector magnitude (EVM) requirement.

22. The first antenna arrangement of claim 1, wherein the regulatory requirement is an adjacent channel power ration (ACPR) requirement.

23. The first antenna arrangement of claim 1, wherein the regulatory requirement comprises one or more radio performance requirements defined in the third Generation Partnership Project (3GPP) specification TS 36.104 v12.3.0.

* * * * *